(12) United States Patent
Taylor et al.

(10) Patent No.: US 6,200,883 B1
(45) Date of Patent: Mar. 13, 2001

(54) ION IMPLANTATION METHOD

(75) Inventors: Mitchell C. Taylor, Lake Oswego, OR (US); Babak Adibi, Santa Clara, CA (US); Majeed Ali Foad, Horsham (GB)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 08/876,593

(22) Filed: Jun. 16, 1997

(30) Foreign Application Priority Data

Jun. 14, 1996 (GB) ................................................. 96124375

(51) Int. Cl.[7] ................................................. H01L 21/265
(52) U.S. Cl. ............................................ 438/514; 438/527
(58) Field of Search .................................... 438/514, 527, 438/528, FOR 161

(56) References Cited

U.S. PATENT DOCUMENTS

| | | | |
|---|---|---|---|
| 3,897,276 | * 7/1975 | Kondo ................................... | 438/527 |
| 4,391,651 | * 7/1983 | Yoder . | |
| 4,536,945 | 8/1985 | Gray et al. . | |
| 5,021,851 | * 6/1991 | Haken et al. . | |
| 5,225,357 | * 7/1993 | Ho ........................................ | 438/527 |
| 5,360,766 | * 11/1994 | Ko et al. .............................. | 437/527 |
| 5,548,143 | * 8/1996 | Lee ...................................... | 438/527 |
| 5,719,425 | * 2/1998 | Akram et al. ......................... | 257/344 |
| 5,736,445 | * 4/1998 | Pfirsch ................................. | 438/527 |
| 5,795,803 | * 8/1998 | Takamura et al. .................... | 438/527 |
| 5,801,878 | * 9/1998 | Jimenez ................................ | 438/527 |
| 5,837,597 | * 11/1998 | Saito .................................... | 438/514 |
| 5,897,363 | * 4/1999 | Gonzalez et al. .................... | 438/527 |
| 5,937,293 | * 8/1999 | Lee ...................................... | 438/247 |
| 6,001,701 | * 12/1999 | Carroll et al. ....................... | 438/527 |

FOREIGN PATENT DOCUMENTS

| | | |
|---|---|---|
| 676802A1 | 10/1995 | (EP) . |
| 00205268A | * 3/1981 | (GB) ........................... 438/FOR 161 |

OTHER PUBLICATIONS

J.H.Freeman et al., United Kingdom Atomic Energy Authority Harwell, "Ion Beam Studies Part V: The Computer Simulation of Composite Ion Implantation Profiles", (Jan. 1977).*

* cited by examiner

*Primary Examiner*—Savitri Mulpuri
(74) *Attorney, Agent, or Firm*—Boult Wade Tennant

(57) ABSTRACT

In ion implantation processes for forming junctions in semiconductor devices, a proportion of ions implant into the semiconductor material beyond the desired junction depth due to channelling along axes and planes of symmetry in the crystal. A method is provided in which ions are implanted at a series of different energies starting with a lower energy than that required for the desired junction depth. The initial amorphising of the surface regions of the semiconductor during the lower energy implantation reduces the channelling probability when the ions are subsequently implanted at the full energy resulting in a more sharply defined junction.

18 Claims, 1 Drawing Sheet

ION IMPLANTATION METHOD

FIELD OF THE INVENTION

This invention relates to a method of ion implantation.

DISCUSSION OF PRIOR ART

Ion implantation is one of the standard processes employed in the manufacture of integrated circuit devices to modify the electrical properties of defined regions of a substrate of semiconductor material by doping these regions with a selected concentration of impurity atoms. The technique involves generating a beam of ions containing a preselected atomic specie and directing the beam towards a target substrate. The depth of implant of the atomic specie depends inter alia on the energy of the specie at implantation which is in turn dependent on the ion beam energy.

There is an increasing demand for ion implantation to be conducted at lower implant energies so that junctions between regions of different conductivity type can be formed in the semiconductor substrate at shallow depths below the substrate surface. Such shallow junctions require implantation at implant energies of less than 10 keV and sometimes less than 2 keV. An implanter which can operate down to low implant energies is the Applied Materials Precision Implant xR80 described in British Patent Specification No. 2307095.

It is important, when forming junctions between regions of different conductivity type in semiconductor wafers that the junctions are formed at a predictable depth beneath the surface of the wafer. It is also often desirable for the concentration of dopant atoms in the region above the junction to be relatively uniform, and to fall away as sharply as possible at the junction itself.

A problem with ion implantation techniques is that a proportion of the ions entering the substrate at the desired implant energy penetrate into the substrate to a depth greater than would be expected from the calculations of the probability of experiencing a collision with an atom of the substrate material. This phenomenon is believed to arise because some ions entering the substrate are "channelled" along axes and planes of symmetry in the crystal. This channelling effect can produce significant concentration levels of the dopant specie beyond the intended junction depth so that the effective junction depth is greater than intended.

FIG. 1 of the accompanying drawings illustrates the effect. This Figure is a graphical representation of the atomic concentration of a desired dopant (here boron) against depth below the surface of the substrate. In the absence of channelling, a junction would be formed at a depth d. However, because of channelling, boron atoms extend in a "tail" 10 beyond depth d so that the actual junction is at depth d+$\Delta$d.

This problem is especially significant if it is intended to form the junction at a relatively shallow depth using low implant energies, as the extent of channelling is greater at lower energies.

One prior art method of reducing the effect of channelling on the concentration profile of the dopant ion is to perform a pre-implant of relatively higher energy silicon ions. This silicon pre-implant has the effect of amorphising the crystalline silicon of the substrate at and beneath the surface of the substrate so that channelling is reduced during subsequent implanting of dopant ions. The energy of the silicon pre-implant is chosen so that the damaged region 11 caused by the implanted silicon extends beyond the intended junction depth to minimise damage in the doped region above the junction.

A problem of this procedure is, however, that the damaged region 11 extending into the region of the substrate beneath the junction, cannot be fully repaired by the subsequent heat treatments of the substrate, for dopant activation, so that some residual damage from the silicon pre-implant remains which can reduce the performance of the resulting devices. Also, the need to conduct a pre-implant with a different material significantly reduces the productivity of the implant machine.

SUMMARY OF THE INVENTION

The present invention provides a method of implanting ions containing a selected atomic specie through a surface of a semiconductor substrate to form a junction between regions of different conductivity type in the substrate at a desired depth below said surface, comprising the steps of selecting in accordance with said desired depth a maximum implant energy of said selected atomic specie and the total dose of said atomic specie to achieve a desired concentration of said specie implanted in the region in front of said junction, and implanting a part of said dose with said atomic specie at below said maximum implant energy before completing said dose at said maximum energy.

With this procedure part of the intended dose of dopant ions is first implanted at a relatively lower energy at which any channelling tail would not extend beyond the junction depth. This initial part of the dose at low energy does, however, cause amorphising of the surface layer of the substrate. As a result, when the dose is completed at the full implant energy, to achieve the desired junction depth, these higher energy ions are implanted through an already amorphised zone so that their channelling probability is very much reduced.

The effect of this procedure is to reduce greatly the channelling tails of implanted ion concentration profiles so that shallow junctions can be formed more reliably. Importantly, no damage to the substrate is caused outside the intended target region.

The required dose may be implanted in at least two steps at different implant energies for the atomic specie. In fact, three or more discreet energy steps may be employed with the energy of each step increasing to the maximum energy for the final step.

Instead, the implant energy may be progressively increased to said maximum, either by continuously increasing the implant energy as the implant progresses, or by incrementing the energy in a large number of relatively small steps.

Preferably, at least 5% of said dose is implanted initially at less than 50% of said maximum energy. In fact, between 5% and 20% of said dose may be implanted initially at less than 50%, and preferably less than 30%, of said maximum energy.

Up to 50% of said dose may be implanted initially at up to 70% of said maximum energy.

The procedure is especially useful for relatively low energy implants, for example where said maximum energy is no greater than 10 keV, or in some cases no greater than 5 keV.

Apart from selecting the energies at which the dose implanted to reduce the number of implanted ions penetrating in the substrate beyond said desired depth, the distribution of energies may also be selected to produce a profile of the concentration of implanted ions in a region of the substrate in front of the junction which is closer to a desired profile. Typically the desired profile may be a concentration which is uniform with depth.

The invention may also be regarded as a method of forming by ion implantation in a semiconductor substrate a junction between regions of different conductivity at a desired depth below a surface of said substrate, comprising implanting ions through said substrate surface at a first energy to amorphise said semiconductor material beneath said surface in front of the desired junction depth and then implanting ions at a higher energy through said amorphised semiconductor.

The energy of implantation of the selected atomic specie may be altered by adjusting the acceleration or deceleration parameters of the implanter so that the same ion beam is used at different final energies.

However, said part of said dose may be implanted by implanting ions having a higher mass to charge ratio than ions implanted to complete said dose. Then, said higher mass to charge ratio ions may be implanted at the same energy as said ions implanted to complete the dose. For example boron may first be implanted using a beam of $BF_2^+$ ions and subsequently changing to $B^+$ ions.

In another aspect, the invention provides a method of implanting ions containing atomic species of a selected conductivity doping type through a surface of a semiconductor substrate to form a junction at a desired depth below said surface between an upper region doped with said atomic species to have said selected conductivity type and a lower region of the opposite conductivity type, the method comprising a first step of implanting ions containing a first atomic specie of said selected conductivity doping type at a first implant energy not greater than the energy required for said first atomic specie to penetrate to said desired depth, and a subsequent step of implanting ions containing a second atomic specie of said selected conductivity doping type which has a lower atomic weight than said first specie at a second implant energy at which said second atomic specie will penetrate to form said junction at said desired depth.

The ions implanted in said first and subsequent steps are at the same energy.

BRIEF DESCRIPTION OF THE DRAWINGS

An example of the present invention will now be described with reference to the accompanying drawings in which.

DESCRIPTION OF PREFERRED EMBODIMENTS

Figure 1:
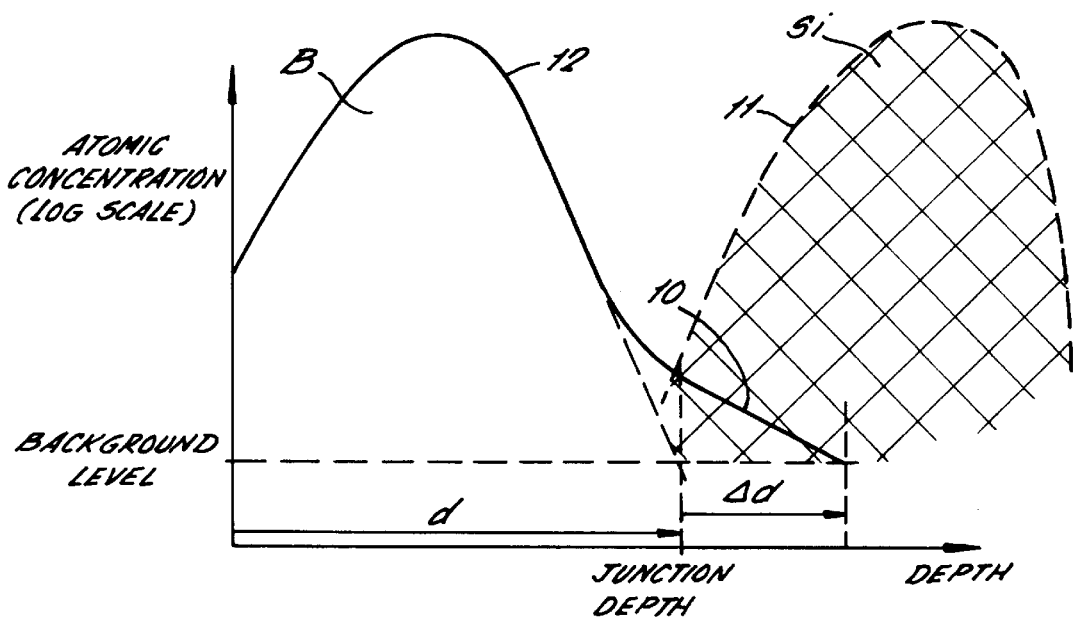
FIG. 1 is a graphical illustration of the concentration of implanted atoms in a silicon substrate with depth in accordance with prior art implanting procedures.

In FIG. 1, the effect of ion channelling during a known implantation processes is illustrated. If boron ions for example are implanted continuously at a predetermined energy, the concentration profile with depth of boron atoms in the silicon substrate has the shape of curve 12 in the drawing. Instead of the concentration dropping to the background level at the desired junction depth d within the substrate, a significant concentration of boron ions is formed at greater depths so that the effective junction depth is increased by Δd. The resulting profile of boron concentration has a so called channelling tail 10.

In the prior art, this effect has been ameliorated by performing a pre-implant at relatively high energy of silicon ions. The purpose of the silicon pre-implant is to amorphise the crystal structure of the silicon below the surface of the substrate. However the implanted silicon also dislocates and damages the crystal structure over a region illustrated in FIG. 1 by the curve 11.

As a result of the amorphisation of the silicon substrate, channelling of subsequently implanted boron ions is reduced so that the undesired channelling tail 10 is also reduced.

However, the degree of crystal damage produced in region 11 can be quite substantial and, importantly, is made to extend well beyond the intended boron implant region, and into deeper regions of the substrate.

It is standard practice to anneal the damage in the implanted wafer by heat treating at temperatures typically between 500° C. and 700° C. There is subsequently an activation treatment at temperatures typically between 900° C. and 1000° C. However, even so residual damage caused by the silicon pre-implant will remain with the effect of reducing the performance of the devices formed in the substrate.

Figure 2:
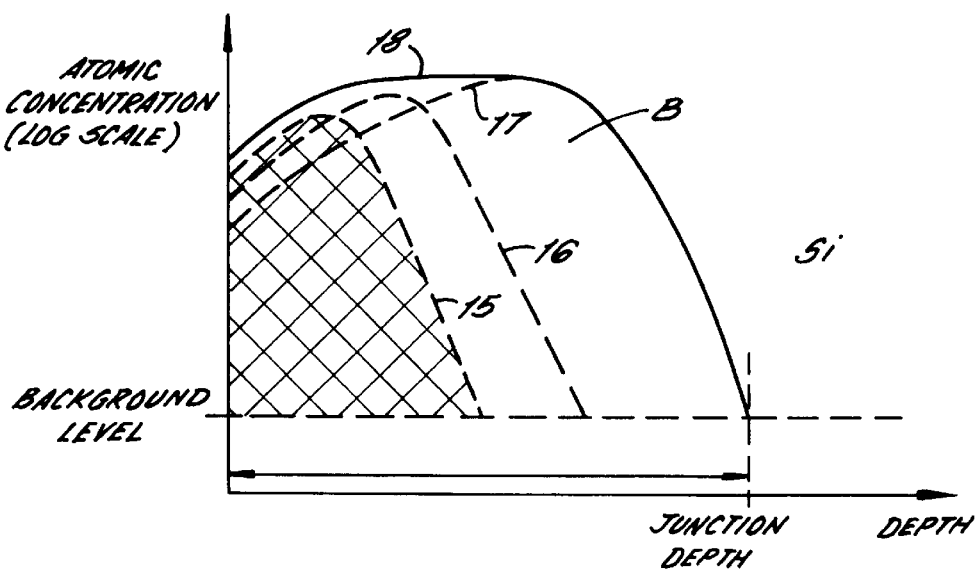
FIG. 2 is a graphical illustration of an example of the implantation method of the present invention.

Referring now to FIG. 2, in an example of the present invention, a boron implant is performed by implanting at two or more different energies, starting with an energy well below the intended maximum implant energy, which is determined in accordance with the desired junction depth. Thus, instead of selecting an implant energy calculated to provide a desired junction depth, and then performing the complete implant at this selected maximum implant energy, in the present example the implant procedure is performed in a series of steps, starting with implantation at lower energies and eventually completing the implant at the maximum energy.

The accumulated effect of performing an implant at a stepped series of energies is illustrated in FIG. 2. In a first step, the boron ions are implanted at an energy well below the maximum implant energy for the desired junction depth to produce an initial profile of concentration of boron atoms in the substrate corresponding to the curve 15. During the course of this initial step, any implant ions which channel to greater depths will still be absorbed before travelling to the desired junction depth. Importantly, the first implant step at lower energies nevertheless produces amorphisation of the crystal structure of the silicon wafer in a surface region of the silicon wafer, corresponding generally to the concentration curve 15, illustrated by the shading of the area under this curve in FIG. 2. This first low energy implant is performed preferably at the highest achievable beam current to maximise the amorphisation caused.

After the first step of implanting, a second step at an intermediate energy may be performed which would produce an additional concentration profile corresponding to curve 16 in FIG. 2. It should be understood that curve 16 corresponds to the concentration of ions implanted only by the second intermediate energy step and does not correspond to the accumulated total concentration of ions absorbed from both the first and second steps.

Because ions implanted during the second step are implanted through the damage region caused by the first implantation step, the probability of channelling for the ions implanted during the second step is substantially reduced. The second step itself produces additional amorphisation somewhat deeper into the substrate. This second step also should be performed at high beam current.

In the illustrated example, a final implantation step is then performed at the full implant energy required to achieve the desired junction depth d. The ions implanted at the full implant energy have to pass through the amorphised regions produced by both of the first two implant steps and as a result the probability of these ions channelling beyond the required junction depth is substantially reduced. The increase in concentration of implanted atoms resulting from the third implantation step is illustrated by curve 17.

The resulting total concentration of ions implanted by all three steps is illustrated by the solid curve 18. Because channelling probability for the ions implanted at the full implant energy is much reduced, there is no substantial channelling tail and the desired junction depth is achieved. Importantly this is achieved without causing substantial damage to the crystal structure beyond the desired junction.

In one example, the first implant step producing the profile 15 in FIG. 2 may be performed at 20% of the desired maximum implant energy and implant 10% of the total ion dose required for the region being implanted. The second intermediate energy implant step may be performed at 60% of the maximum energy and constitute 20% of the total dose. The final implant step at the maximum energy provides 70% of the total dose.

An additional advantage of this stepped implant procedure is that the profile 18 of the total concentration of atoms in the implanted region can be rendered more ideal by suitably controlling the energies and dosages of the different implant steps. In the example shown in FIG. 2, the profile is rendered relatively uniform in concentration over a substantial part of the total depth of the implanted region.

Advantages are obtained if the implantation process is performed in only two steps, with a single initial implant step at a lower energy, so that the second full energy implant step is performed implanting ions through the damage region caused by the first step. However, multiple implant steps may be preferred to minimise the channelling tails produced and to achieve the desired concentration profile in the implanted region.

In one arrangement, the implantation energy may be varied substantially continuously during an implantation process, with the energy starting at a relatively low value and increasing, either in a large number of small steps or continuously up to the maximum implant energy. At the same time, the beam current may be varied to achieve the desired dose rate at each energy. Software modifications required to automate the described procedures will be straightforward to the skilled person.

The process described above is especially useful for relatively low energy implants for forming junctions at shallow depths in the semiconductor substrate. Typical maximum implant energies for the process are less than 10 keV and may be 5 keV or less.

Referring to FIG. 2, in the case of a maximum implant energy of 5 keV, the first step may be performed at an energy of 1 keV and the second step performed at an energy of 3 keV. Preferably, the beam current used, even for the initial step at 1 keV, should be at least 1 mA, and preferably 2 mA or more.

In the above described example, the energy of the implanted atomic specie (here boron) is adjusted by changing the energy of the ion beam itself and assumes that the ion beam contains the same ions for all three steps of the implantation process. However, it would also be possible to adjust the energy of implantation of a selected atomic specie by implanting using a beam of different ions. For example, if the first implantation step is performed using singly charge $BF_2$ ions at an energy of say 5 keV, the effective energy of the boron atom which dissociates from the fluorine on implantation into the substrate will be less than 1 keV. The energy of the $BF_2$ ion is split on impact with the substrate between the various atoms forming the ion in accordance with their atomic masses.

If the ion beam is then switched to a beam of singly charged boron atoms also at 5 keV, these boron ions are subsequently implanted at the full 5 keV beam energy.

In some circumstances it may be more convenient to perform the different steps of the implantation process by selecting different ion masses whilst maintaining the beam energy at implantation constant. It will be understood to persons skilled in this art that ion beam implantation apparatus typically include a mass selection capability to allow only ions of one specific mass to charge ratio to proceed in the beam for implantation. Also in the case of implanting boron, it is common practice to use $BF_3$ gas as feed stock in the ion source so that the extracted ion beam typically includes a number of ion masses including $B^+$ and $BF_2^+$.

Another advantage of performing the initial low energy implantation step using ions having a higher mass to charge ratio is that such relatively heavy ions tend to cause more amorphisation of the substrate on impact, so that the advantages of this method may be greater. In general, the initial low energy implant may be performed employing ions with high mass to charge ratio and apart from compounds such as $BF_2$, cluster ions comprising a number of boron atoms clustered together with a single charge, may also be employed.

Also the above description has particularly referred to the implantation of the atomic specie boron, which is used to provide P type doping, the procedure may also be used for implanting other species. For example, As or P may be implanted to provide N type doping. In one example for N type doping, the initial implant may be performed using As which has a relatively high atomic mass (about 75) and then the subsequent implant step may be performed with P which has an atomic mass of about 31. The energy of implantation of each of these atoms may be selected so that the initial implantation with As produces a maximum amount of amorphisation at the surface of the substrate whilst avoiding the possibility of the As atoms penetrating beyond the desired junction depth, and the subsequent or final implantation with P is at sufficient energy to form the junction at the desired depth.

Some advantage might be obtained even if both the As and the P are implanted at the same energy by first implanting with whichever specie has a lower penetration probability, or at least has a greater propensity to cause amorphisation.

For P type doping it may be preferable to use Ga or In initially for better amorphisation at the lower energies.

Once implantation is completed the implanted substrate may be annealed with the RTP Centura™ from Applied Materials, Inc.

What is claimed is:

1. A method of ion beam implanting ions containing a selected atomic specie through a surface of a semiconductor substrate to form a junction between regions of different conductivity type in the substrate at a desired depth below said surface, comprising the steps of selecting in accordance with said desired depth a maximum implant energy of said selected atomic specie and the total dose of said atomic specie to achieve a desired concentration of said specie implanted in the region in front of said junction, and ion beam implanting a part of said dose with said atomic specie at below said maximum implant energy before completing said dose at said maximum energy, said maximum energy being no greater than 10 keV.

2. A method of implanting as claimed in claim 1, wherein said dose is implanted in at least two steps at different implant energies for said atomic specie.

3. A method of implanting as claimed in claim 1, wherein said implant energy is progressively increased to said maximum.

4. A method of implanting as claimed in claim 1, wherein at least 5% of said dose is implanted initially at less than 50% of said maximum energy.

5. A method of implanting as claimed in claim 4, wherein between 5% and 20% of said dose is implanted initially at less than 50% of said maximum energy.

6. A method of implanting as claimed in claim 5, wherein between 5% and 20% of said dose is implanted initially at less than 30% of said maximum energy.

7. A method of implanting as claimed in claim 1, wherein up to 50% of the said dose is implanted initially at up to 70% of said maximum energy.

8. A method of implanting as claimed in claim 1, wherein said maximum energy is no greater than 5 keV.

9. A method of implanting as claimed in claim 1, wherein the energies at which said dose is implanted are selected to reduce the number of implanted ions penetrating in the substrate beyond said desired depth.

10. A method of implanting as claimed in claim 1, wherein the energies at which said dose is implanted are selected to produce a profile of the concentration of implanted ions in a region of the substrate in front of the junction which is closer to a desired ideal profile.

11. A method of implanting as claimed in claim 10, wherein said desired ideal profile is a concentration which is uniform with depth.

12. A method of forming by ion beam implantation in a semiconductor substrate, a junction between region of different conductivity at a desired depth below a surface of said substrate comprising ion beam implanting ions through said substrate surface at a first energy to amorphise said semiconductor material beneath said surface in front of the desired junction depth and then ion beam implanting ions at a higher energy through said amorphised semiconductor, said higher energy being no greater than 10 keV.

13. A method of implanting as claimed in claim 1, wherein said part of said dose is implanted by implanting ions having a higher mass to charge ratio than ions implanted to complete said dose.

14. A method of implanting as claimed in claim 13, wherein said higher mass to charge ratio ions are implanted at the same energy as said ions implanted to complete the dose.

15. A method of implanting ions containing atomic species of a selected conductivity doping type through a surface of a semiconductor substrate to form a junction at a desired depth below said surface between an upper region doped with said atomic species to have said selected conductivity type and a lower region of the opposite conductivity type, the method comprising a first step of implanting ions containing a first atomic specie of said selected conductivity doping type at a first implant energy less than the energy required for said first atomic specie to penetrate to said desired depth, and a subsequent step of implanting ions containing a second atomic specie of said selected conductivity doping type which has a lower atomic weight than said first specie at a second implant energy at which said second atomic specie will penetrate to form said junction at said desired depth, said second implant energy being no greater than 10 keV.

16. A method of implanting ions as claimed in claim 15, wherein the ions implanted in said first and subsequent steps are at the same energy.

17. A semiconductor device having an implanted region formed by a method as claimed in any of claims 1, 12 or 15.

18. An integrated circuit incorporating a semiconductor device as claimed in claim 17.

* * * * *